United States Patent [19]
Harvey

[11] Patent Number: 6,017,806
[45] Date of Patent: Jan. 25, 2000

[54] METHOD TO ENHANCE DEUTERIUM ANNEAL/IMPLANT TO REDUCE CHANNEL-HOT CARRIER DEGRADATION

[75] Inventor: Kenneth C. Harvey, Dallas, Tex.

[73] Assignee: Texas Instruments Incorporated, Dallas, Tex.

[21] Appl. No.: 09/123,260

[22] Filed: Jul. 28, 1998

Related U.S. Application Data

[60] Provisional application No. 60/053,976, Jul. 28, 1997.

[51] Int. Cl.$^7$ .................................................. H01L 21/265
[52] U.S. Cl. ........................... 438/475; 438/38; 438/509; 438/522
[58] Field of Search .................................... 438/792, 798, 438/475, 38, 509, 522, 530, 585; 257/607

[56] References Cited

U.S. PATENT DOCUMENTS

| | | | |
|---|---|---|---|
| 4,331,709 | 5/1982 | Risch et al. | 438/144 |
| 4,581,195 | 4/1986 | Akimune | 376/129 |
| 4,962,065 | 10/1990 | Brown et al. | 438/792 |
| 5,510,277 | 4/1996 | Cunninbham et al. | 438/707 |
| 5,711,998 | 1/1998 | Shufflebotham | 427/535 |
| 5,872,387 | 2/1999 | Lyding et al. | 257/607 |

OTHER PUBLICATIONS

Lisenker et al. WO 94/19829 (PCT/US94/01669), "Semiconductor Device Comprising Deuterium Atoms", pp. 1–17, Sep. 1, 1994.

Saks et al. "The Time–Dependence of Post–Irradiation Interface Trap Build–up in Deuterium–Annealed Oxides", IEEE, pp. 2220–2229, Dec. 6, 1992.

Ipattova et al. "Effect of Localized Vibrations on the Si Surface Concentrations of H and D", J. Appl. Phys., pp. 814–819, Jan. 15, 1998.

Saks et al. "Time–Dependence of the Interface Trap Build–up in Deuterium–Annealed Oxides after Irradiation", Appl. Phys. Lett. 61, pp. 3014–3016, Dec. 21, 1992.

Joseph w.Lyding "UHV STM Nanofabrication: Progress, Technology Spin–Offs, and Challenges" IEEE, pp. 589–600, Apr. 1997.

*Primary Examiner*—Carl Whitehead, Jr.
*Assistant Examiner*—Maria Guerrero
*Attorney, Agent, or Firm*—Wade James Brady, III; Richard L. Donaldson

[57] ABSTRACT

A method of fabricating a semiconductor device wherein there is provided a partially fabricated semiconductor device having a $Si/SiO_2$ interface in which all processing steps involving heating of the device to a temperature above the Si-hydrogen dissociation temperature for a sufficient time to cause at least substantial dissociation of hydrogen from silicon have been completed. The device is immersed in a deuterium ambient for a sufficient time to permit the device structure in the region of the $Si/SiO_2$ interface to have an excess of deuterium atoms. The device is then heated to a temperature above the dissociation temperature of hydrogen-silicon bonds for a time sufficient to cause substantial dissociation of hydrogen and/or deuterium from Si in the region of the $Si/SiO_2$ interface while the deuterium remains in the device structure at the Si and $SiO_2$ interface. The temperature of the device is then lowered to below the hydrogen-silicon dissociation temperature; and fabrication of the device is completed in standard manner. The $SiO_2$ is generally the gate oxide of an MOS transistor. The step of immersing is at a temperature of from about 400 degrees C. to about 450 degrees C. for at least 60 minutes. The step of heating is at a temperature of from about 500 to about 550 degrees C. for a period of from about 15 to about 30 minutes. The step of lowering the temperature is to ambient temperature of about 22 degrees C.

20 Claims, 1 Drawing Sheet

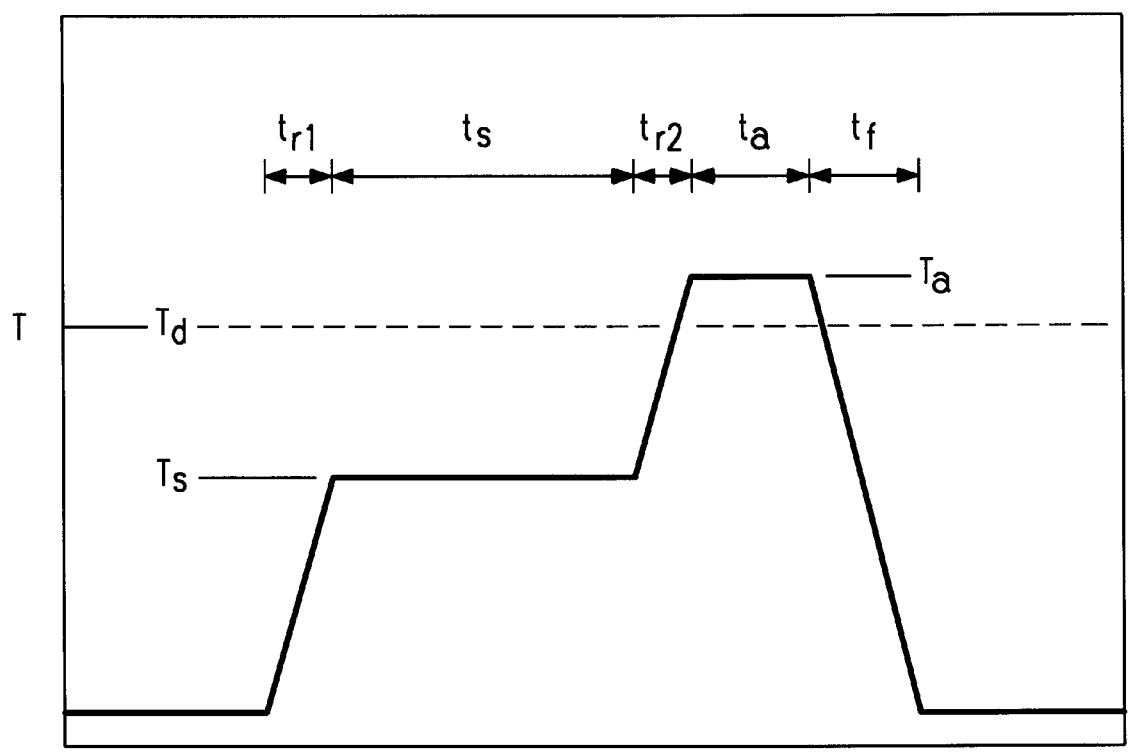

METHOD TO ENHANCE DEUTERIUM ANNEAL/IMPLANT TO REDUCE CHANNEL-HOT CARRIER DEGRADATION

This application claims priority under 35 USC 119(e)(1) of provisional application No. 60/053,976 filed Jul. 28, 1997.

BACKGROUND OF THE INVENTION

1. Field of the Invention

This invention is a method of improving the channel-hot-carrier (CHC) lifetime of Si MOS and particularly CMOS transistors that have a $SiO_2$ gate insulator fabricated of $SiO_2$ or related materials.

2. Brief Description of the Prior Art

During the operation of semiconductor devices, particularly Si MOS devices having a $SiO_2$ gate insulator, CHC effects cause the performance of the MOS transistors to progressively degrade over time. Some parameters of the transistor, such as the drain voltage and the gate length, can be changed to at least partly reduce this problem and improve the reliability of the device. However, these changes typically degrade the initial performance of the transistor, such as saturation current and speed. It is known that a higher performance, more reliable transistor can be fabricated by reducing the intrinsic CHC degradation. It is also known that a deuterium and/or hydrogen anneal can reduce the intrinsic CHC degradation over time. Deuterium and/or hydrogen diffuses to the gate electrode insulator, which is typically $SiO_2$, and becomes chemically attached to the dangling Si bonds at the $Si/SiO_2$ interface. This helps to prevent the formation of interface traps during CHC stress conditions which degrade the transistor performance over time.

Deuterium is preferred over hydrogen since it is significantly more effective than hydrogen at preventing the formation of the interface traps during CHC stress, as taught by J. W. Lyding et al. in an article entitled "Reduction of hot electron degradation in metal oxide semiconductor transistors by deuterium processing" *Applied Physics Letters,* Vol. 68, No. 18, Apr. 29, 1996, pp. 2526–2528. Lyding et al. noted that replacing hydrogen with deuterium during the final wafer sintering process reduces hot electron degradation effects in metal oxide semiconductor transistors. The exact cause of this large isotope effect was not known. This substitution increased the CHC lifetime of the transistor by factors of 10 to 50, this being borne out by the applicant herein. Lyding et al. delivered the deuterium to the region of the gate oxide in an oven through thermal diffusion. At present, CMOS devices are usually annealed in a deuterium gas at constant temperature of 400 to 450 degrees C. for 30 to 60 minutes and then cooled. This gas may be pure deuterium or a deuterium/gas inert to the process, preferably nitrogen, mixture. However, since Lyding et al. did not anneal near the end of the process flow, it is possible that prior steps in the process flow introduced hydrogen into the device structure. Therefore, it may be that many of the dangling bond sites at the $Si/SiO_2$ interface are already occupied by hydrogen and so cannot be occupied by the deuterium. While the CHC lifetime can be improved by introduction of deuterium into bonding sites, the deuterium can only bond at the appropriate sites if such sites are available. This pre-existing hydrogen will occupy some bonding sites at the gate oxide/Si substrate interface region and, therefore, will prevent the deuterium from occupying these bonding sites. Later, these hydrogen-occupied sites will degrade faster than the deuterium-occupied sites during CHC stress and therefore lower the CHC lifetime of the device compared to a device that has a larger percentage of sites occupied with deuterium. It further follows that even when bonding with deuterium does take place at available Si bonding sites, such bonds are or can be broken when later fabrication steps involve heating to a temperature above $T_d$, the temperature at which the bond between the hydrogen and/or deuterium and the Si is broken, causing the hydrogen and/or deuterium to diffuse through the Si wafer. If more hydrogen is present at the interface and if both the hydrogen and deuterium are competing for available Si bonds, the hydrogen will occupy a significant number of Si bond locations and the above-described problem will be present.

SUMMARY OF THE INVENTION

It is therefore apparent that it is desirable to populate as many bonding sites as possible with deuterium and maintain this bonding to deuterium rather than hydrogen. This problem has been overcome in accordance with the present invention.

Briefly, in accordance with the present invention, after all processing steps which require temperatures above the temperature $T_d$ at which the hydrogen-Si bond will dissociate (this being about 500 degrees C. for Si interfaces) have been completed, the device being fabricated is immersed in an ambient of deuterium or deuterium-containing gas inert to the procedure other than the deuterium, preferably nitrogen, for a period sufficient to allow the deuterium to diffuse to the $Si$—$SiO_2$ interface. For devices tested by applicant to date, this time $T_s$ was about 60 minutes at a temperature $T_S$ of from about 400 to about 450 degrees C. and preferably about 450 degrees C. This diffusion may be done at any step in the semiconductor process flow, such that there are no further steps in the process flow with a temperature greater than $T_d$ ($T \geq T_d$) for a significant time $t_a$, to dissociate the deuterium at the bonding sites. It may be that during the sintering process, the time $t_s$ will be longer so that the deuterium may diffuse through all materials to reach the $Si/SiO_2$ interface, especially in those cases where several layers of metalization are located between the surface and the $Si/SiO_2$ interface. It should be understood that these temperatures and times depend on the device structure and that it is necessary to provide sufficient deuterium in the ambient for a sufficient period of time to flood the $Si/SiO_2$ interface with deuterium. This provides a larger percentage of deuterium atoms relative to hydrogen atoms in the vicinity of the $Si/SiO_2$ interface for later use as will be explained. The temperature is then raised above the dissociation temperature $T_d$ for the shortest time and at the lowest temperature (generally about 525 degrees C. for about 15 minutes) to cause all hydrogen and/or deuterium to silicon bonds to be broken. This also allows more deuterium to diffuse to the interface and the hydrogen to diffuse away from the interface. The temperature should be sufficiently low and the time should be sufficiently short that there is low degradation of the integrated circuit structure, such as metalization (metal layers). The time and temperature numbers will depend in part upon device geometry and is generally from about 500 to about 550 degrees C. and from about 15 to about 60 minutes. The hydrogen and deuterium atoms that have dissociated due to the rise in temperature above the hydrogen/Si dissociation temperature Td will begin to diffuse out of the structure of the device being fabricated and the deuterium will continue to diffuse to the interface as previously discussed. The temperature is then lowered below the dissociation temperature Td to a temperature of from about 400 to about 450 degrees C. to about room temperature, preferably at a rate of from about 1 to about 20 degrees per minute, the total time requiring about 30 minutes, at which time the hydrogen and deuterium atoms in the structure vie for available Si bonding sites. Since the number of deuterium atoms now exceeds the number of hydrogen atoms at the $Si/SiO_2$ interface, the number of bonds with deuterium exceeds the number of bonds with hydrogen. Furthermore, since all high temperature processing steps have been completed, no significant further dissociation of the hydrogen and/or deuterium will take place. Fabrication of the device is then completed with final encapsulation without subjecting the device to temperatures above the hydrogen/Si dissociation temperature $t_d$.

The above described description of the invention is the nominal process and many other possibilities will be readily apparent.

It should be understood that, although the gate insulator material herein is referred to as silicon dioxide, the claims herein may also apply to gate insulators that also contain nitrides or are solely comprised of nitrides.

It should be understood that a particular device may have a $T_d$ that differs from 500 degrees C. If such is the case, then the appropriate $T_d$ should be used instead of 500 degrees C.

It should be understood that the above described procedure can be used to fabricate a semiconductor device with deuterium being placed at the $Si/SiO_2$ interface by procedures that employ implantation rather than or in addition to diffusion. In general, deuterium implantation is accomplished so that during subsequent thermal cycles, the deuterium will diffuse to the gate oxide/Si interface and become chemically attached to the dangling bonds at that interface, this generally being the $Si/SiO_2$ or poly $Si/SiO_2$ interface. The energy, dose and point defects of the implant are optimized to effect this.

The above described procedures can be combined with rapid quenching at the end of the anneal (heating to a temperature above the hydrogen-Si dissociation temperature) to increase the deuterium concentration in the device structure.

BRIEF DESCRIPTION OF THE DRAWING

The FIGURE is a graph of the temperature cycle during anneal in accordance with the present invention.

DESCRIPTION OF THE PREFERRED EMBODIMENT

A partially fabricated semiconductor device is provided having a Si substrate and a $SiO_2$ gate oxide region thereover and for which processing steps which require temperature sufficiently high and for a sufficient time length to cause appreciable dissociation of hydrogen or deuterium from a Si-hydrogen or deuterium bond have been completed. With reference to the FIGURE, the device was placed in an enclosed chamber having a deuterium ambient and the temperature was raised to 425 degrees C., shown in the FIGURE as time $t_{r1}$ and temperature $T_S$, and held at that temperature for 60 minutes, shown in the FIGURE as time $t_S$ to permit deuterium to diffuse through the device to the $Si/SiO_2$ interface. The temperature was then raised to 525 degrees C. as shown in the FIGURE as time $t_{r2}$ and temperature T a and held at that temperature for 15 minutes, shown in the FIGURE as time t a to permit the existing Si-hydrogen and Si-deuterium bonds to dissociate, leaving an excess of deuterium atoms in the structure of the Si and $SiO_2$ at the interface region relative to the hydrogen atoms. The temperature was then lowered to room temperature, as shown in the FIGURE as time $t_f$ with the hydrogen and deuterium in the device structure vying for the available Si sites for bonding. Since the number of deuterium atoms in the structure exceed the number of hydrogen atoms, most of the bonding sites will bond with deuterium instead of with hydrogen.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of fabricating a semiconductor device which comprises the steps of:
   (a) providing a partially fabricated semiconductor device having an interface of silicon with an electrically insulating dielectric in which dangling bond sites at said interface are occupied by hydrogen and wherein all processing steps involving heating of the device to a temperature above the bond site-hydrogen dissociation temperature for a sufficient time to cause substantial dissociation of hydrogen and deuterium, if present, from the dangling bond sites having been completed;
   (b) immersing said device in a deuterium ambient which is inert to the processing step then being conducted and to processing steps to be conducted for a sufficient time to permit the structure in the region of said interface to contain an excess of deuterium atoms;
   (c) heating said device to a temperature above the dissociation temperature of hydrogen-bond site bonds for a time sufficient to cause substantial dissociation of hydrogen and/or deuterium from the bond site in the region of said interface while an excess of deuterium from step (b) remains in the structure in the region of said interface;
   (d) lowering the temperature of said device to below the hydrogen-bond site dissociation temperature while said excess of deuterium exists in the region of said interface to permit said deuterium at said interface to bond with bond sites from which hydrogen and/or deuterium have been dissociated; and
   (e) completing fabrication of said device without raising the temperature of said device in the region of said interface to the dissociation temperature of said bond site and deuterium.

2. The method of claim 1 wherein said step of lowering the temperature is to ambient temperature of about 22 degrees C.

3. The method of claim 1 wherein said bond sites are silicon bond sites and wherein said electrically insulating dielectric is taken from the group consisting of silicon dioxide, silicon nitride and combinations of silicon dioxide and silicon nitride.

4. The method of claim 1 wherein said step of immersing is at a temperature of from about 400 degrees C. to about 450 degrees C. for at least 30 minutes.

5. The method of claim 1 wherein said step of heating is at a temperature of from about 500 to about 550 degrees C. for a period of from about 15 to about 30 minutes.

6. The method of claim 3 wherein said step of lowering the temperature is to ambient temperature of about 22 degrees C.

7. The method of claim 3 wherein said step of immersing is at a temperature of from about 400 degrees C. to about 450 degrees C. for at least 30 minutes.

8. The method of claim 3 wherein said step of heating is at a temperature of from about 500 to about 550 degrees C. for a period of from about 15 to about 30 minutes.

9. The method of claim 3 wherein said electrically insulating dielectric is the gate oxide of an MOS transistor.

10. The method of claim 4 wherein said step of heating is at a temperature of from about 500 to about 550 degrees C. for a period of from about 15 to about 30 minutes.

11. The method of claim 4 wherein said step of lowering the temperature is to ambient temperature of about 22 degrees C.

12. The method of claim 7 wherein said step of heating is at a temperature of from about 500 to about 550 degrees C. for a period of from about 15 to about 30 minutes.

13. The method of claim 7 wherein said step of lowering the temperature is to ambient temperature of about 22 degrees C.

14. The method of claim 7 wherein said electrically insulating dielectric is the gate oxide of an MOS transistor.

15. The method of claim 5 wherein said step of lowering the temperature is to ambient temperature of about 22 degrees C.

16. The method of claim 8 wherein said step of lowering the temperature is to ambient temperature of about 22 degrees C.

17. The method of claim 8 wherein said electrically insulating dielectric is the gate oxide of an MOS transistor.

18. The method of claim 10 wherein said step of lowering the temperature is to ambient temperature of about 22 degrees C.

19. The method of claim 12 wherein said step of lowering the temperature is to ambient temperature of about 22 degrees C.

20. The method of claim 19 wherein said electrically insulating dielectric is the gate oxide of an MOS transistor.

* * * * *